United States Patent
Horinek

(10) Patent No.: US 12,419,021 B2
(45) Date of Patent: Sep. 16, 2025

(54) INFRARED CLOAKING MATERIAL

(71) Applicant: David Horinek, Weare, NH (US)

(72) Inventor: David Horinek, Weare, NH (US)

(*) Notice: Subject to any disclaimer, the term of this patent is extended or adjusted under 35 U.S.C. 154(b) by 14 days.

(21) Appl. No.: 18/633,315

(22) Filed: Apr. 11, 2024

(65) Prior Publication Data

US 2024/0349469 A1    Oct. 17, 2024

Related U.S. Application Data

(60) Provisional application No. 63/495,496, filed on Apr. 11, 2023.

(51) Int. Cl.
*H05K 9/00* (2006.01)

(52) U.S. Cl.
CPC .................. *H05K 9/0088* (2013.01)

(58) Field of Classification Search
CPC ....................................................... H05K 9/0088
See application file for complete search history.

(56) References Cited

U.S. PATENT DOCUMENTS

| | | | |
|---|---|---|---|
| 5,312,678 A * | 5/1994 | McCullough, Jr. | F41H 3/00 442/247 |
| 9,134,465 B1 * | 9/2015 | Cohen | F41H 3/00 |
| 2009/0218523 A1 * | 9/2009 | Kare | H01Q 5/30 250/505.1 |
| 2010/0110559 A1 * | 5/2010 | Cai | F41H 3/00 703/1 |
| 2011/0171374 A1 * | 7/2011 | Smolyaninov | G02B 1/002 427/160 |
| 2017/0111024 A1 * | 4/2017 | Nathan | H01Q 17/008 |

* cited by examiner

*Primary Examiner* — Hung V Ngo

(57) ABSTRACT

An infrared cloaking material includes a copper-coated fabric and a layer of zinc oxide. The copper-coated fabric includes an inner layer of copper, a layer of fabric, and an outer layer of copper as the layer of fabric is composed of an inner fabric surface and an outer fabric surface. The inner fabric surface and the outer fabric surface being positioned opposite of each other about the layer of fabric. The inner layer of copper is superimposed onto and across the inner fabric surface. The outer layer of copper is superimposed onto and across the outer fabric surface. The layer of zinc oxide is positioned adjacent to the inner layer of copper, opposite of the layer of fabric as the layer of zinc oxide is superimposed onto and across the inner layer of copper.

19 Claims, 5 Drawing Sheets

INFRARED CLOAKING MATERIAL

The current application claims a priority to the U.S. Provisional Patent application Ser. No. 63/495,496 filed on Apr. 11, 2023.

FIELD OF THE INVENTION

The present invention relates generally to a material that camouflages a heat source. More specifically, the present invention is an infrared (IR) cloaking material that shields humans and makes them undetectable on (infrared) IR cameras.

BACKGROUND OF THE INVENTION

IR radiation is characterized by wavelengths ranging from 0.750 micrometer (m) to 1000 µm that is the same as 750 nanometers (nm) to 1000000 nm. Due to limitations on the detector range, IR radiation is often divided into three smaller regions: 0.750-3.000 µm, 3.0-30.0 µm, and 30-1000 µm that are defined as near-infrared (NIR), mid-wave infrared (MWIR), and far-infrared (FIR) respectively. Infrared cloaking technology is an emerging technology that involves masking or hiding objects from infrared detection by making them less visible to infrared sensors and cameras. Infrared radiation is a type of electromagnetic radiation that is emitted from objects with a temperature above absolute 0 such as humans, animals, and machines. Many IR sensors and cameras are utilized by military and surveillance systems to monitor and track objects based on their IR signature. Current IR technology changes the way an object emits or reflects IR radiation, which in turn makes the object less visible to IR sensors or cameras. However, much of the current IR cloaking technology utilizes a silver coated material that is very expensive to manufacture and distribute. Furthermore, the silver coated materials have reached certain effectiveness limitations.

An objective of the present invention is to provide users with an IR cloaking material, to help shield humans from IR sensors and cameras. The present invention intends to provide users with a fabric material that is coated with copper and zinc oxide. In order to accomplish that, a preferred embodiment of the present invention alters a standard fabric material with copper and zinc oxide to achieve a camouflage technology that shields IR radiation. Thus, the present invention is a camouflage technology that shields humans from IR sensors and cameras.

SUMMARY OF THE INVENTION

The present invention is an IR cloaking material to help shield objects and devices from detection from IR cameras and sensors. The present invention seeks to provide users with a material that has a variety of potential applications but is not limited to military, defense, surveillance, security, and scientific research applications. In order to accomplish this, the present invention uses copper and zinc oxide to shield the human body's peak emission of 9.4 µm and cover the range of 7.5 µm to 12 µm. Further, copper and zinc oxide are applied to the material with a specialized coating technique.

DETAILED DESCRIPTION OF THE INVENTION

All illustrations of the drawings are for the purpose of describing selected versions of the present invention and are not intended to limit the scope of the present invention.

The present invention is an infrared (IR) cloaking material that shields humans or any other heat sources from infrared cameras. More specifically, the present invention is able to provide a cost-effective IR cloaking material with respect to the existing IR cloaking material that is very expensive to manufacture and distribute due to the usage of silver.

Figure 1:
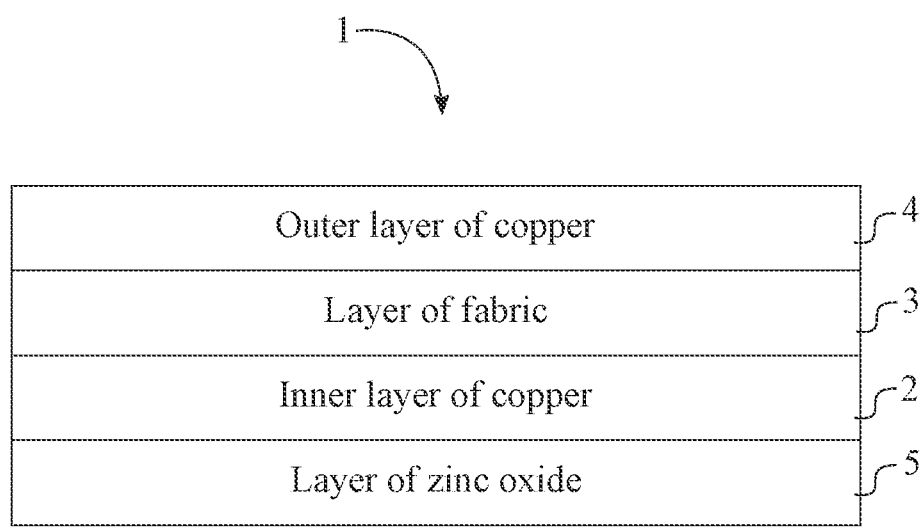
FIG. 1 is a schematic view showing the configuration of the present invention.
Figure 2:
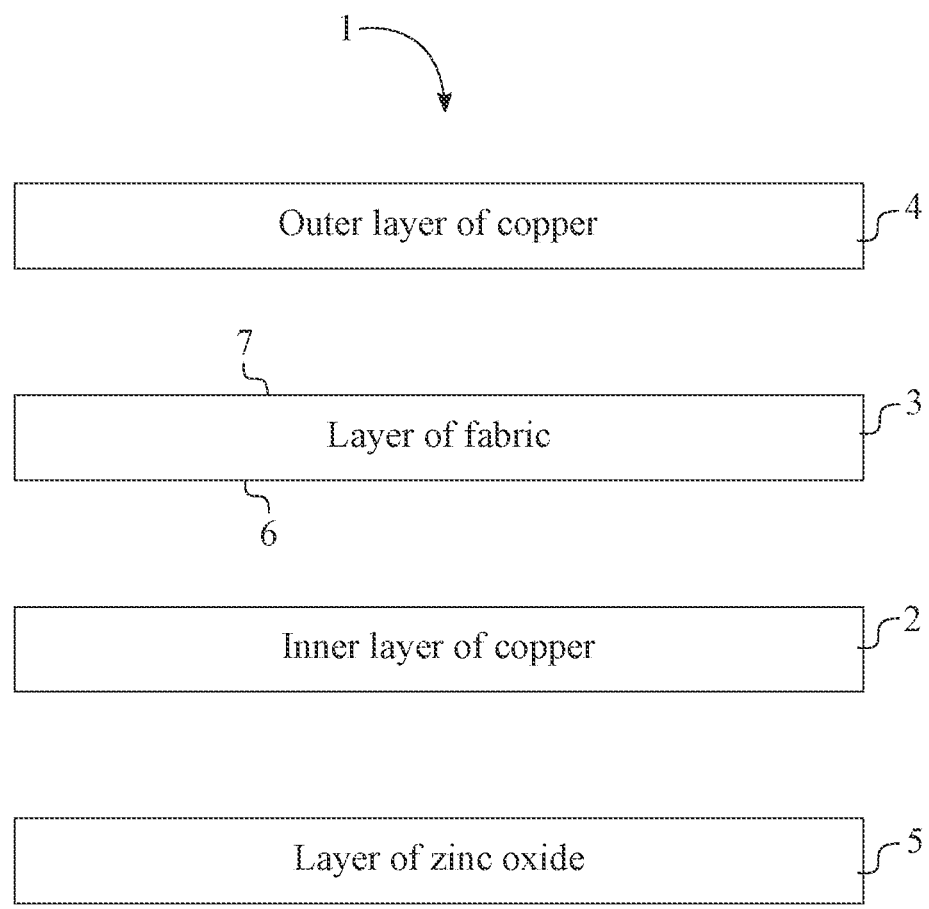
FIG. 2 is an exploded schematic view showing the configuration of the present invention.

As shown in FIG. 1 and FIG. 2, the present invention comprises a copper-coated fabric 1 and a layer of zinc oxide 5 to manufacture the IR cloaking material. The copper-coated fabric 1 comprises an inner layer of copper 2, a layer of fabric 3, and an outer layer of copper 4. The inner layer of copper 2 and the outer layer of copper 4 are oppositely positioned of each other about the layer of fabric 3. More specifically, the layer of fabric 3 comprises an inner fabric surface 6 and an outer fabric surface 7 as the inner fabric surface 6 and the outer fabric surface 7 are positioned opposite of each other about the layer of fabric 3. Then, the inner layer of copper 2 is superimposed onto and across the inner fabric surface 6 to fully enclose the inner fabric surface 6 of the layer of fabric 3. The outer layer of copper 4 is superimposed onto and across the outer fabric surface 7 to fully enclose the outer fabric surface 7 of the layer of fabric 3. In other words, the layer of fabric 3 is encapsulated by the inner layer of copper 2 and the outer layer of copper 4. It is essential that the inner layer of copper 2 and the outer layer of copper 4 are coated to the layer of fabric 3 during the manufacturing rather than utilizing the composite method to enhance the reflectiveness of the copper.

In reference to FIG. 1 and FIG. 2, the layer of zinc oxide 5 is positioned adjacent to the inner layer of copper 2 and positioned opposite of the layer of fabric 3. Resultantly, the layer of zinc oxide 5 is superimposed onto and across the inner layer of copper 2 thus creating a desired mirror finish with a very low emissivity element. The layer of zinc oxide 5 configured to absorb an infrared radiation ranging between the 7.5 micrometer (µm) to 12 µm. In the preferred embodiment of the present invention, the layer of zinc oxide 5 is coated onto the inner layer of copper 2 by a doctor blading process, also known as knife coating or blade coating, with a mirror finish. The doctor blading process is a fabrication technique that involves running a blade over a substrate or moving a substrate underneath the blade, wherein the gap between the blade and substrate determines how much solution can get through and how effectively the solution can be spread. Preferably, a thickness of the layer of zinc oxide 5 is 1 µm to 60 µm. Preferably, the layer of zinc oxide 5 is made of a plurality of zinc oxide particles as a particle size of each of the plurality of zinc oxide particles ranges from 0.2 µm to 50 µm. Furthermore, the layer of zinc oxide 5 may comprise a zinc chemical constituent and an oxygen chemical constituent as the zinc chemical constituent is 1 to 20 percentage by weight (wt. %) of the layer of zinc oxide 5. Furthermore, the zinc chemical constituent is made of a plurality of zinc particles, and wherein a particle size of each of the plurality of zinc particles ranges from 40 nanometer (nm) to 1000 nm.

Figure 3:
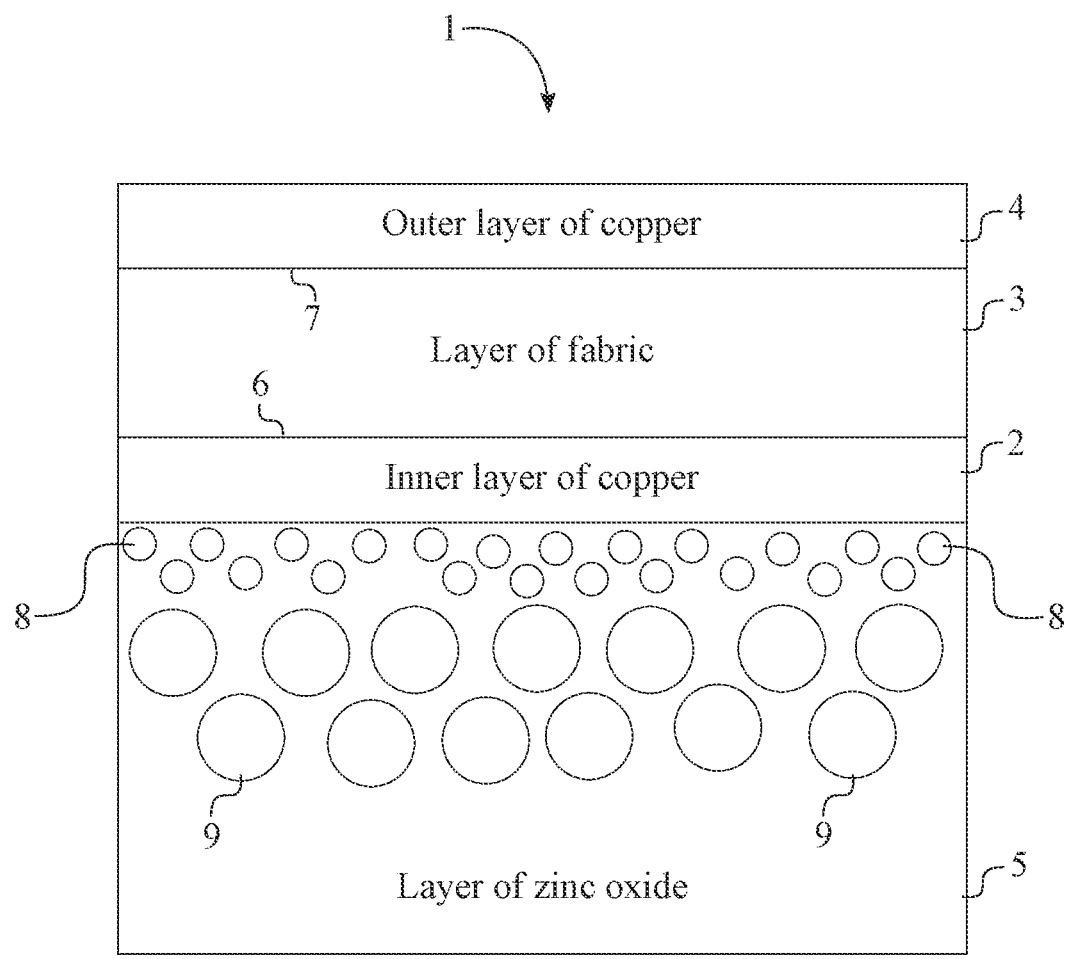
FIG. 3 is a schematic view showing the configuration of the present invention, showing the plurality of smaller particles and the plurality of larger particles within the layer of zinc oxide.

As shown in FIG. 3, the layer of zinc oxide 5 may comprise a plurality of smaller particles 8 and a plurality of larger particles 9. The plurality of smaller particles 8 is positioned on the inner layer of copper 2 and proximal to the inner fabric surface 6. The plurality of larger particles 9 is positioned on the inner layer of copper 2 and distal to the inner fabric surface 6. The preferred method and usage of the layer of zinc oxide 5 allows for a greater surface area along the inner layer of copper 2 due to the plurality of smaller particles 8 having a larger surface area to volume ratio. In other words, a given weight of the plurality of smaller particles 8 within the layer of zinc oxide 5 covers a larger surface area of the layer of fabric 3 than the same weight of the plurality of larger particles 9 of the layer of zinc oxide 5, resulting in a more uniform and complete coating of the inner layer of copper 2. Furthermore, the plurality of smaller particles 8 within the layer of zinc oxide 5 improves adhesion as the plurality of smaller particles 8 of the layer of zinc oxide 5 penetrate the small crevices and irregularities in the inner layer of copper 2. Furthermore, the plurality of smaller particles 8 of the layer of zinc oxide 5 are able to improve the camouflage performance. For example, the plurality of smaller particles 8 of the layer of zinc oxide 5 are more effective at scattering and absorbing IR radiation thus resulting in the present invention to be less visible to IR sensors and cameras. Furthermore, the plurality of smaller particles 8 of the layer of zinc oxide 5 improves flexibility of the present invention and does not hinder the flexibility or other properties of the present invention.

Figure 4:
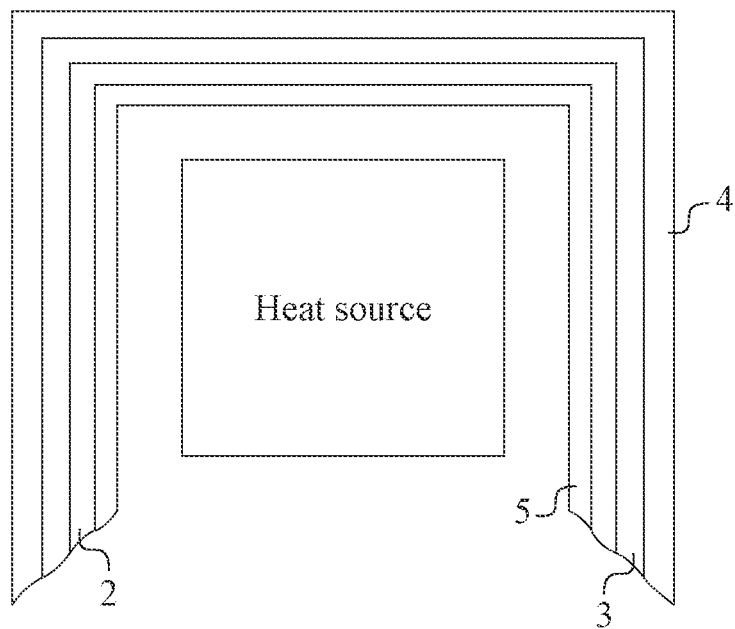
FIG. 4 is a schematic view showing the usage of the present invention in reference to the heat source.

Once the layer of zinc oxide 5 is applied onto the copper-coated fabric 1, the present invention can be utilized to construct wearable clothing or undergarments. More specifically, the layer of zinc oxide 5 is configured to be oriented toward the heat source, and the outer layer of copper 4 is configured to be oriented away from the heat source as shown in FIG. 4. In other words, the layer of zinc oxide 5 is positioned adjacent to the body or heat source and functions as the inner face of the present invention while the outer layer of copper 4 functions as the outer face of the present invention.

Figure 5:
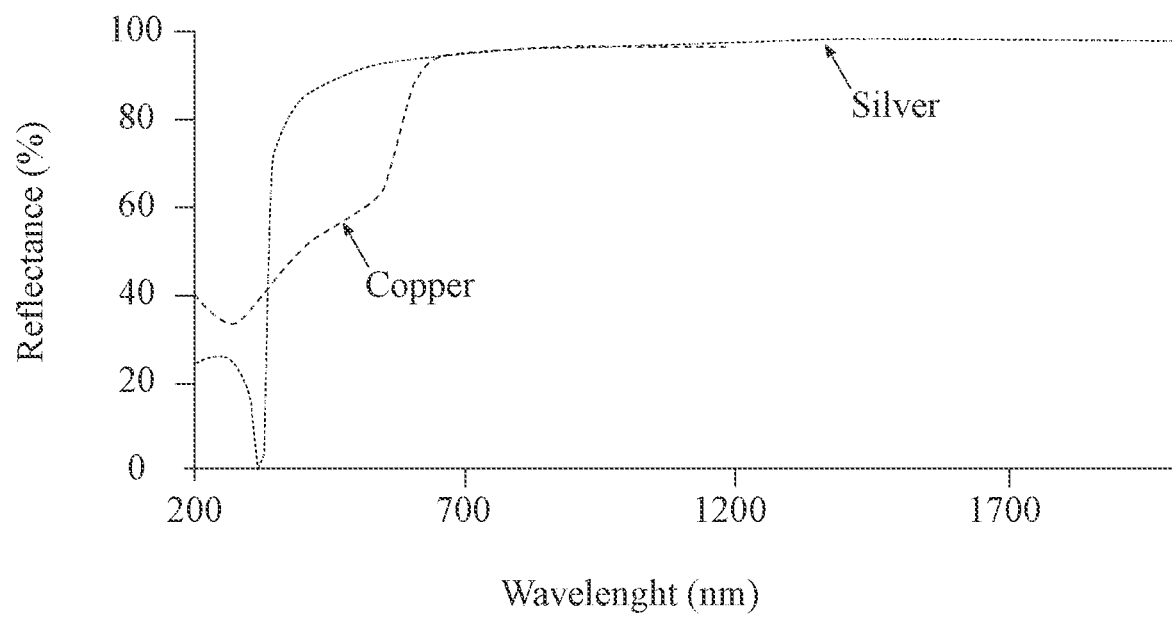
FIG. 5 is a view showing the reflectance of the copper and the silver with respect to the wavelength.

The present invention aids to make military soldiers and equipment invisible to IR cameras and sensors when within the field to protect them from being exposed to harm. In an effort to reduce manufacturing costs, the present invention uses the copper-coated fabric 1 and the layer of zinc oxide 5 in place of silver as the silver and the copper have approximately the same 98.5% IR radiation reflectance efficiency as seen in FIG. 5.

The present invention has been tested against other IR cloaking materials such as the industry standard Rip Stop 30D 40 gram, the 3.25 Metalized Mesh, and the 4.0 Opsy Double. Each of these test results have shown that the present invention shields a heated element from IR radiation detection over a period of 20 minutes at a better efficiency than the industry standard and other IR cloaking materials. It should be further noted that the present invention can be coated with various materials to shield IR radiation in various ways while still staying within the scope of the present invention. Results of the industry standard Rip Stop 30D 40 gram, the 3.25 Metalized Mesh, and the 4.0 Opsy Double are listed below, wherein the present invention is listed as the IR cloaking material with copper and zine oxide.

| Rip Stop 30D 40-gram test with heating elements of 104 degrees of Fahrenheit (° F.) | Industry standard cloaking materials with Silver | IR cloaking material with copper and zine oxide |
| --- | --- | --- |
| After 5 minutes | 88.7° F. | 82.76° F. |
| After 10 minutes | 92.3° F. | 83.3° F. |
| After 15 minutes | 92.84° F. | 83.3° F. |
| After 20 minutes | 93.02° F. | 83.48° F. |

| 3.25 Metalized Mesh test with heating elements of 119 degrees of Fahrenheit (° F.) | Industry standard cloaking materials with Silver | IR cloaking material with copper and zine oxide |
| --- | --- | --- |
| After 5 minutes | 98.24° F. | 84.2° F. |
| After 10 minutes | 99.68° F. | 84.38° F. |
| After 15 minutes | 98.6° F. | 85.64° F. |
| After 20 minutes | 99.32° F. | 85.1° F. |

| 4.0 Opsy Double test with heating elements of 119 degrees of Fahrenheit (° F.) | Industry standard cloaking materials with Silver | IR cloaking material with copper and zine oxide |
| --- | --- | --- |
| After 5 minutes | 105.08° F. | 84.38° F. |
| After 10 minutes | 105.44° F. | 84.02° F. |
| After 15 minutes | 105.8° F. | 84.38° F. |
| After 20 minutes | 105.98° F. | 84.56° F. |

Although the invention has been explained in relation to its preferred embodiment, it is to be understood that many other possible modifications and variations can be made without departing from the spirit and scope of the invention as hereinafter claimed.

What is claimed is:

1. An infrared cloaking material comprising:
   a copper-coated fabric;
   a layer of zinc oxide;
   the copper-coated fabric comprising an inner layer of copper, a layer of fabric, and an outer layer of copper;
   the layer of fabric comprising an inner fabric surface and an outer fabric surface;
   the inner fabric surface and the outer fabric surface being positioned opposite of each other about the layer of fabric;
   the inner layer of copper being superimposed onto and across the inner fabric surface;
   the outer layer of copper being superimposed onto and across the outer fabric surface;
   the layer of zinc oxide being positioned adjacent to the inner layer of copper, opposite of the layer of fabric; and
   the layer of zinc oxide being superimposed onto and across the inner layer of copper.

2. The infrared cloaking material as claimed in claim 1, wherein the layer of zinc oxide is configured to orient toward a heat source.

3. The infrared cloaking material as claimed in claim 1, wherein the outer layer of copper is configured to orient away a heat source.

4. The infrared cloaking material as claimed in claim 1, wherein a thickness of the layer of zinc oxide is 1 micrometer ($\mu m$) to 60 $\mu m$.

5. The infrared cloaking material as claimed in claim 1, wherein the layer of zinc oxide is made of a plurality of zinc oxide particles, and wherein a particle size of each of the plurality of zinc oxide particles ranges from 0.2 $\mu m$ to 50 $\mu m$.

6. The infrared cloaking material as claimed in claim 1, wherein the layer of zinc oxide comprises a zinc chemical constituent and an oxygen chemical constituent, and wherein the zinc chemical constituent is 1 to 20 percentage by weight (wt. %) of the layer of zinc oxide.

7. The infrared cloaking material as claimed in claim 6, wherein the zinc chemical constituent is made of a plurality of zinc particles, and wherein a particle size of each of the plurality of zinc particles ranges from 40 nanometer (nm) to 1000 nm.

8. The infrared cloaking material as claimed in claim 1, wherein the layer of zinc oxide is configured to absorb an infrared radiation ranging between 7.5 $\mu m$ to 12 $\mu m$.

9. The infrared cloaking material as claimed in claim 1, wherein the layer of zinc oxide is coated onto the inner layer of copper by a doctor blading process with a mirror finish.

10. The infrared cloaking material as claimed in claim 1 comprising:
    the layer of zinc oxide comprises a plurality of smaller particles and a plurality of larger particles;
    the plurality of smaller particles being positioned on the inner copper layer;
    the plurality of larger particles being positioned on the inner copper layer;
    the plurality of smaller particles being positioned proximal to the inner fabric surface; and
    the plurality of larger particles being positioned distal to the inner fabric surface.

11. The infrared cloaking material as claimed in claim 1, wherein a thickness of the layer of zinc oxide is 1 micrometer ($\mu m$) to 60 $\mu m$.

12. An infrared cloaking material comprising:
    a copper-coated fabric;
    a layer of zinc oxide;
    the copper-coated fabric comprising an inner layer of copper, a layer of fabric, and an outer layer of copper;
    the layer of fabric comprising an inner fabric surface and an outer fabric surface;
    the inner fabric surface and the outer fabric surface being positioned opposite of each other about the layer of fabric;
    the inner layer of copper being superimposed onto and across the inner fabric surface;
    the outer layer of copper being superimposed onto and across the outer fabric surface;
    the layer of zinc oxide being positioned adjacent to the inner layer of copper, opposite of the layer of fabric;
    the layer of zinc oxide being superimposed onto and across the inner layer of copper; and
    the layer of zinc oxide being configured to absorb an infrared radiation ranging between 7.5 $\mu m$ to 12 $\mu m$.

13. The infrared cloaking material as claimed in claim 12, wherein the layer of zinc oxide is configured to orient toward a heat source.

14. The infrared cloaking material as claimed in claim 12, wherein the outer layer of copper is configured to orient away a heat source.

15. The infrared cloaking material as claimed in claim 12, wherein the layer of zinc oxide is made of a plurality of zinc oxide particles, and wherein a particle size of each of the plurality of zinc oxide particles ranges from 0.2 $\mu m$ to 50 $\mu m$.

16. The infrared cloaking material as claimed in claim 12, wherein the layer of zinc oxide comprises a zinc chemical constituent and an oxygen chemical constituent, and wherein the zinc chemical constituent is 1 to 20 percentage by weight (wt. %) of the layer of zinc oxide.

17. The infrared cloaking material as claimed in claim 16, wherein the zinc chemical constituent is made of a plurality of zinc particles, and wherein a particle size of each of the plurality of zinc particles ranges from 40 nanometer (nm) to 1000 nm.

18. The infrared cloaking material as claimed in claim 12, wherein the layer of zinc oxide is coated onto the inner layer of copper by a doctor blading process with a mirror finish.

19. The infrared cloaking material as claimed in claim 12 comprising:
    the layer of zinc oxide comprises a plurality of smaller particles and a plurality of larger particles;
    the plurality of smaller particles being positioned on the inner copper layer;
    the plurality of larger particles being positioned on the inner copper layer;
    the plurality of smaller particles being positioned proximal to the inner fabric surface; and
    the plurality of larger particles being positioned distal to the inner fabric surface.

* * * * *